(12) United States Patent
Park et al.

(10) Patent No.: US 8,860,073 B2
(45) Date of Patent: Oct. 14, 2014

(54) LIGHT-EMITTING DEVICE PACKAGE

(71) Applicant: Samsung Electronics Co., Ltd., Suwon-Si (KR)

(72) Inventors: Hun-yong Park, Seoul (KR); Choo-ho Kim, Gyeonggi-do (KR); Won-ho Jung, Seoul (KR); Jin-ki Hong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 13/709,302

(22) Filed: Dec. 10, 2012

(65) Prior Publication Data

US 2013/0307003 A1    Nov. 21, 2013

(30) Foreign Application Priority Data

May 15, 2012    (KR) .................... 10-2012-0051650

(51) Int. Cl.
| | |
|---|---|
| *H01L 33/00* | (2010.01) |
| *H01L 33/54* | (2010.01) |
| *H01L 33/46* | (2010.01) |
| *H01L 33/48* | (2010.01) |
| *H01L 33/62* | (2010.01) |
| *H01L 33/60* | (2010.01) |

(52) U.S. Cl.
CPC .............. *H01L 33/46* (2013.01); *H01L 33/486* (2013.01); *H01L 2224/48091* (2013.01); *H01L 33/48* (2013.01); *H01L 33/62* (2013.01); *H01L 33/54* (2013.01); *H01L 33/483* (2013.01); *H01L 33/60* (2013.01)

USPC ................ 257/99; 257/98; 257/100; 257/79; 438/26; 438/29

(58) Field of Classification Search
CPC ..... H01L 33/48; H01L 33/483; H01L 33/486; H01L 33/52; H01L 33/54; H01L 33/56; H01L 33/58; H01L 33/60
USPC ..................... 257/79, 98, 99, 100; 438/26, 29
See application file for complete search history.

(56) References Cited

U.S. PATENT DOCUMENTS

| | | | |
|---|---|---|---|
| 2003/0168720 A1* | 9/2003 | Kamada .................. | 257/666 |
| 2006/0022215 A1* | 2/2006 | Arndt et al. .............. | 257/99 |
| 2006/0102918 A1* | 5/2006 | Su et al. .................. | 257/99 |
| 2009/0134408 A1* | 5/2009 | Park et al. ................ | 257/88 |
| 2010/0072506 A1* | 3/2010 | Bae et al. ................. | 257/99 |

FOREIGN PATENT DOCUMENTS

| | | |
|---|---|---|
| JP | 2003-282955 A | 10/2003 |
| JP | 2007-305785 A | 11/2007 |
| JP | 2009-099923 A | 5/2009 |
| JP | 2010-129655 A | 6/2010 |
| KR | 10-0665262 B1 | 1/2007 |

* cited by examiner

*Primary Examiner* — Chuong A Luu
*Assistant Examiner* — Cory Eskridge
(74) *Attorney, Agent, or Firm* — Harness, Dickey & Pierce, P.L.C.

(57) ABSTRACT

A light-emitting device package may include a pre-mold and a molding member. The pre-mold may include an upper body having a inclined (e.g., concavely) plane from which a plurality of vertical holes passing through the upper body are formed and a lower body having an upper surface that meets the inclined (e.g., concavely) plane under the upper body to form a concave unit. The molding member may fill the plurality of vertical holes and the concave unit.

18 Claims, 2 Drawing Sheets

LIGHT-EMITTING DEVICE PACKAGE

CROSS-REFERENCE TO RELATED APPLICATIONS

This application claims the benefit of Korean Patent Application No. 10-2012-0051650, filed on May 15, 2012, in the Korean Intellectual Property Office, the disclosure of which is incorporated herein in its entirety by reference.

BACKGROUND

1. Field

Example embodiments relate to light-emitting device packages having a structure in which a molding member stably combines to a free mold.

2. Description of the Related Art

Light-emitting devices, e.g., light-emitting diodes (LEDs), are semiconductor devices that realize light having various colors by forming a light-emitting source through a PN junction of a compound semiconductor. The light-emitting devices are semiconductor devices that convert electrical energy to light energy and are formed of a compound semiconductor that emits light having a specific wavelength according to an energy band gap. The application fields of light-emitting devices are gradually increasing from optical communications and displays, e.g., computer monitors, and back light units for liquid crystal displays (LCDs) to illumination devices.

In a light-emitting device package in which a light-emitting device is disposed on a concave unit of a pre-mold, a molding member that covers the light-emitting device is formed on the concave unit. If a large amount of vibration is applied to the light-emitting device package, the molding member may be separated from the pre-mold and, as a result, wires that connect the light-emitting device to leads may be disconnected.

SUMMARY

Example embodiments provide light-emitting device packages in which a molding member is stably bonded to a pre-mold because a plurality of vertical holes formed in a inclined plane of a pre-mold are filled with the molding member. Additional aspects will be set forth in part in the description which follows and, in part, will be apparent from the description, or may be learned by practice of example embodiments.

According to example embodiments, a light-emitting device package may include a pre-mold including an upper body and a lower body, the upper body having a inclined plane from which a plurality of vertical holes passing through the upper body are formed and the lower body having an upper surface configured to contact the inclined plane under the upper body to form a concave unit, a pair of leads between the upper body and the lower body, the pair of leads separate from each other, a light-emitting device on one of the pair of leads, a wire configured to connect the light-emitting device to at least one of the pair of leads, and a molding member configured to fill the plurality of vertical holes and the concave unit.

The plurality of vertical holes may be vertical to the lower body. The plurality of vertical holes may form a concentric circle in the inclined plane. The inclined plane may be concavely shaped. The plurality of vertical holes may be formed in the concentric circle having a distance between each other. The plurality of vertical holes may have a diameter in a range from about 0.1 mm to about 0.5 mm.

At least one of the plurality of vertical holes may be formed in a region that does not meet the pair of leads passing through at least a portion of the lower body. A reflection film may be on the inclined plane, and the reflection film may include a plurality of holes connected to the plurality of vertical holes.

According to example embodiments, a light-emitting device package may include a pre-mold including an upper body and a lower body, the upper body having a inclined plane from which a plurality of vertical holes pass through, and a molding member configured to fill the plurality of vertical holes.

The lower body may include an upper surface configured to contact the inclined plane under the upper body to form a concave unit. A pair of leads may be between the upper body and the lower body, the pair of leads separate from each other, a light-emitting device may be on one of the pair of leads, and a wire may be configured to connect the light-emitting device to at least one of the pair of leads. At least one of the plurality of vertical holes may be formed in a region that does not meet the pair of leads passing through at least a portion of the lower body.

The molding member may further be configured to fill the concave unit. The plurality of vertical holes may be vertical to the lower body. The inclined plane may be concavely shaped. The plurality of vertical holes may form a concentric circle in the inclined plane. The plurality of vertical holes may have a diameter in a range from about 0.1 mm to about 0.5 mm. A reflection film may be on the inclined plane, and the reflection film may include a plurality of holes connected to the plurality of vertical holes.

In the light-emitting device package according to example embodiments, a bonding force between the pre-mold and the molding member is increased because the molding member is formed in the vertical holes that are formed on the inclined plane of the pre-mold. Therefore, the separation of the molding member from the pre-mold is prevented or reduced.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
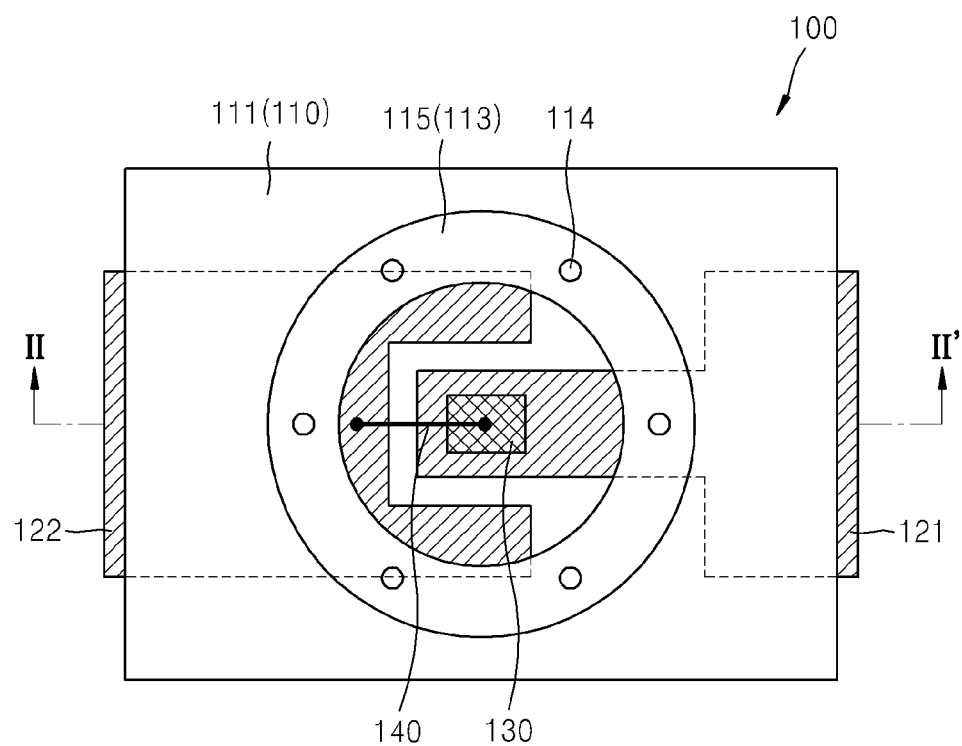
FIG. 1 is a plan view of a light-emitting device package according to example embodiments.

Reference will now be made in detail to example embodiments, examples of which are illustrated in the accompanying drawings. In the drawings, thicknesses may be exaggerated for clarity of layers and regions. Like reference numerals are used for like elements throughout the specification. When an element is referred to as being "on" another element, it can be directly on the other layer or substrate, or intervening layers may also be present.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", "vertical", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" other elements or features would then be oriented "above" the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
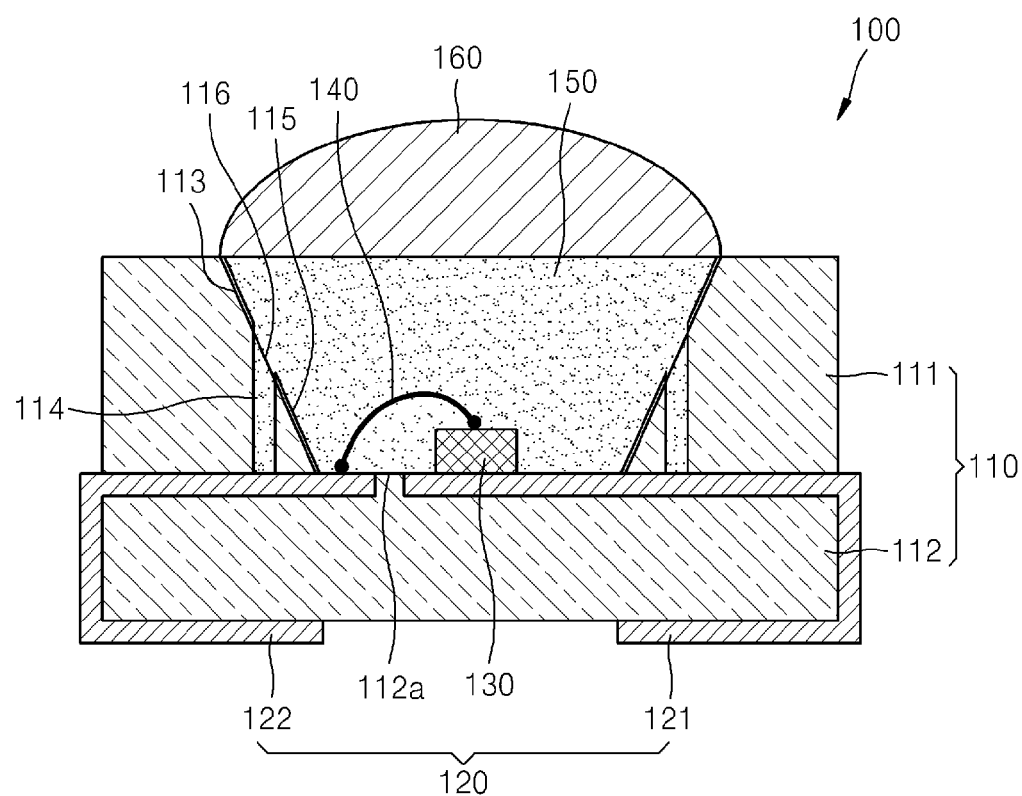
FIG. 2 is a cross-sectional view taken along line II-II' of FIG. 1.

FIG. 1 is a plan view of a light-emitting device package 100 according to example embodiments. FIG. 2 is a cross-sectional view taken along line II-II' of FIG. 1. In FIG. 1, for convenience of explanation, a molding member and a lens unit are not depicted.

Referring to FIGS. 1 and 2, the light-emitting device package 100 may include a pre-mold 110 formed of an upper body 111 and a lower body 112. A plurality of lead frames 120 that surround a portion of the lower body 112 and are separate from each other are formed between the upper body 111 and the lower body 112. The lead frames 120 may be a pair of lead frames. The pair of lead frames may include a first lead frame 121 and a second lead frame 122.

A light-emitting device 130 that emits light may be mounted on the first lead frame 121. The light-emitting device 130 may be connected to the second lead frame 122 through a wire 140.

The pre-mold 110 supports and protects the light-emitting device 130, and may be formed of one of polyphthalamide (PPA), liquid crystal polymer, and ceramic. The pre-mold 110 may have various shapes.

The upper body 111 may include a inclined (e.g., concavely) plane 113, a diameter of which gradually decreases towards the lower body 112. A reflection unit 115 that upwardly reflects light emitted from the light-emitting device 130 may further be formed on the inclined (e.g., concavely) plane 113. The reflection unit 115 may be formed by coating a material having a relatively high reflectance, e.g., Ag or Al, to effectively reflect light emitted from the light-emitting device 130.

Although it is depicted that the pre-mold 110 includes the upper body 111 and the lower body 112, the upper body 111 and the lower body 112 may be formed as one body.

A plurality of vertical holes 114 passing through the upper body 111 may be formed in the inclined (e.g., concavely) plane 113. A plurality of holes 116 may be formed in the reflection unit 115 to connect to the vertical holes 114. The vertical holes 114 may be formed substantially vertical to an upper surface of the lower body 112. The vertical holes 114 may be formed concentrically in the inclined (e.g., concavely) plane 113 with a predetermined or given distance between each of the vertical holes. The vertical holes 114 may have a diameter in a range from about 0.1 mm to about 0.5 mm. The vertical holes 114 may expose upper surfaces of the lead frames 120. The vertical holes 114 may be formed through a portion of the lower body 112 where the vertical holes 114 do not meet the lead frames 120.

The inclined (e.g., concavely) plane 113 of the upper body 111 and an upper surface 112a of the lower body 112 form a concave unit. The concave unit may be filled with a molding member 150 to cover and protect the light-emitting device 130 and the wire 140. As depicted in FIG. 2, the molding member 150 may also be filled in the vertical holes 114.

The molding member 150 may be formed of a transparent material, e.g., an epoxy resin or a silicon resin, so that light emitted from the light-emitting device 130 may be transmitted to the outside. Also, the molding member 150 may further include a diffuser that allows light emitted from the light-emitting device 130 to be uniformly emitted by scattering the light. The diffuser may be barium titanate, titanium oxide, or aluminum oxide. A phosphor may further be included in the molding member 150. The phosphor may emit light having a wavelength different from that of light emitted from the light-emitting device 130 by absorbing a portion of the light.

A lens unit 160 may further be formed on the molding member 150. The lens unit 160 may be formed of a transparent resin, e.g., an epoxy resin or a silicon resin.

The lead frames 120 supply an external power to the light-emitting device 130. A portion of each of the first lead frame 121 and the second lead frame 122 may be interposed between the upper body 111 and the lower body 112, and the other portion thereof may surround the lower body 112.

The light-emitting device 130 may have a compound semiconductor stacked structure having a PN junction structure, and may emit light by the recombination of electrons and holes supplied by applying power through the lead frames 120. The light-emitting device 130 may be attached onto the upper surface of the first lead frame 121 to be electrically connected to the first lead frame 121. For example, the light-emitting device 130 may be attached to the first lead frame 121 through a conductive bond. A p-type electrode and an n-type electrode (not shown) may be disposed on an upper surface and a lower surface of the light-emitting device 130, respectively, and the n-type electrode may be attached to the first lead frame 121 and the p-type electrode may be connected to the second lead frame 122 through the wire 140. Although it is depicted that the light-emitting device 130 of FIG. 2 is a vertical-type light-emitting device, example embodiments are not limited thereto. For example, the light-emitting device 130 may be a horizontal-type light-emitting device which may be connected to the first lead frame 121 and the second lead frame 122 via wires, respectively. The wire 140 may connect the light-emitting device 130 to the first lead frame 121, and may be formed of Au or Al.

According to example embodiments, vertical holes may be formed in a inclined (e.g., concavely) plane of a pre-mold, and the vertical holes may be filled with a molding resin. Accordingly, a bonding force between the molding resin and the pre-mold is strong, and molding resin represses the contraction or expansion of the molding member in the vertical holes. Accordingly, even if a relatively severe vibration is applied to the light-emitting device package, the separation of the molding resin from the pre-mold is prevented or reduced, and thus, the disconnection of a wire that connects the light-emitting device to leads may be prevented or reduced.

In example embodiments, a light-emitting device is described. However, example embodiments are not limited thereto. For example, a photodiode may be installed instead of the light-emitting device, and thus, electromagnetic radiation may be received from the outside. In example embodiments, the above-mentioned structure including the molding member filling in the vertical holes may be applied thereto.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A light-emitting device package comprising:
   a pre-mold including an upper body and a lower body, the upper body having a inclined plane from which a plurality of vertical holes passing through the upper body are formed and the lower body having an upper surface configured to contact the inclined plane under the upper body to form a concave unit;
   a pair of leads between the upper body and the lower body, the pair of leads separate from each other;
   a light-emitting device on one of the pair of leads;
   a wire configured to connect the light-emitting device to at least one of the pair of leads; and
   a molding member configured to fill the plurality of vertical holes and the concave unit.

2. The light-emitting device package of claim 1, wherein the plurality of vertical holes are vertical to the lower body.

3. The light-emitting device package of claim 1, wherein the inclined plane is concavely shaped.

4. The light-emitting device package of claim 1, wherein the plurality of vertical holes form a concentric circle in the inclined plane.

5. The light-emitting device package of claim 4, wherein the plurality of vertical holes are formed in the concentric circle having a distance between each other.

6. The light-emitting device package of claim 1, wherein the plurality of vertical holes have a diameter in a range from about 0.1 mm to about 0.5 mm.

7. The light-emitting device package of claim 1, wherein at least one of the plurality of vertical holes is formed in a region that does not meet the pair of leads passing through at least a portion of the lower body.

8. The light-emitting device package of claim 1, further comprising:
   a reflection film on the inclined plane, the reflection film including a plurality of holes connected to the plurality of vertical holes.

9. A light-emitting device package comprising:
   a pre-mold including an upper body and a lower body, the upper body having a inclined plane from which a plurality of vertical holes pass through; and
   a molding member configured to fill the plurality of vertical holes.

10. The light-emitting device package of claim 9, wherein the lower body includes an upper surface configured to contact the inclined plane under the upper body to form a concave unit.

11. The light-emitting device package of claim 10, further comprising:
   a pair of leads between the upper body and the lower body, the pair of leads separate from each other;
   a light-emitting device on one of the pair of leads; and
   a wire configured to connect the light-emitting device to at least one of the pair of leads.

12. The light-emitting device package of claim 11, wherein at least one of the plurality of vertical holes is formed in a region that does not meet the pair of leads passing through at least a portion of the lower body.

13. The light-emitting device package of claim 10, wherein the molding member is further configured to fill the concave unit.

14. The light-emitting device package of claim 9, wherein the plurality of vertical holes are vertical to the lower body.

15. The light-emitting device package of claim 9, wherein the inclined plane is concavely shaped.

16. The light-emitting device package of claim 9, wherein the plurality of vertical holes form a concentric circle in the inclined plane.

17. The light-emitting device package of claim 9, wherein the plurality of vertical holes have a diameter in a range from about 0.1 mm to about 0.5 mm.

18. The light-emitting device package of claim 9, further comprising:
   a reflection film on the inclined plane, the reflection film including a plurality of holes connected to the plurality of vertical holes.

* * * * *